United States Patent
Lochman et al.

(10) Patent No.: US 11,095,091 B2
(45) Date of Patent: Aug. 17, 2021

(54) PACKAGES FOR HIGH-POWER LASER DEVICES

(71) Applicants: Bryan Lochman, Somerville, MA (US); Matthew Sauter, Cambridge, MA (US); Bien Chann, Merrimack, NH (US); Michael Deutsch, Derry, NH (US)

(72) Inventors: Bryan Lochman, Somerville, MA (US); Matthew Sauter, Cambridge, MA (US); Bien Chann, Merrimack, NH (US); Michael Deutsch, Derry, NH (US)

(73) Assignee: TERADIODE, INC., Wilmington, MA (US)

( * ) Notice: Subject to any disclaimer, the term of this patent is extended or adjusted under 35 U.S.C. 154(b) by 0 days.

(21) Appl. No.: 16/654,339

(22) Filed: Oct. 16, 2019

(65) Prior Publication Data
US 2021/0028596 A1    Jan. 28, 2021

Related U.S. Application Data

(63) Continuation-in-part of application No. 15/627,917, filed on Jun. 20, 2017, now Pat. No. 10,490,972.

(60) Provisional application No. 62/352,239, filed on Jun. 20, 2016.

(51) Int. Cl.
*H01S 5/024* (2006.01)
*H01S 5/40* (2006.01)
*H01S 5/02355* (2021.01)

(52) U.S. Cl.
CPC ........ *H01S 5/02423* (2013.01); *H01S 5/4025* (2013.01); *H01S 5/02355* (2021.01)

(58) Field of Classification Search
None
See application file for complete search history.

(56) References Cited

U.S. PATENT DOCUMENTS

| | | | |
|---|---|---|---|
| 5,263,536 A | 11/1993 | Hulburd et al. | |
| 6,097,744 A | 8/2000 | Takigawa et al. | |
| 9,001,856 B1 | 4/2015 | Govorkov et al. | |
| 2001/0004370 A1 | 6/2001 | Miyajima et al. | |
| 2004/0028094 A1* | 2/2004 | Betin | H01S 3/042 372/35 |
| 2006/0203866 A1 | 9/2006 | Stephens | |
| 2009/0190619 A1 | 7/2009 | Qi et al. | |
| 2010/0118902 A1* | 5/2010 | Wu | H01S 5/024 372/36 |

(Continued)

FOREIGN PATENT DOCUMENTS

JP    2007149978    6/2007

OTHER PUBLICATIONS

International Search Report, for International Application No. PCT/US2017/0387271, dated Aug. 23, 2017, 10 pages.

*Primary Examiner* — Tod T Van Roy
(74) *Attorney, Agent, or Firm* — Morgan, Lewis & Bockius LLP

(57) ABSTRACT

In various embodiments, a laser emitter such as a diode bar is cooled during operation via jets of cooling fluid formed by ports in a cooler on which the laser emitter is positioned. The jets strike an impingement surface of the cooler that is thermally coupled to the laser emitter but prevents direct contact between the cooling fluid and the laser emitter itself.

23 Claims, 11 Drawing Sheets

(56) References Cited

U.S. PATENT DOCUMENTS

| | | | |
|---|---|---|---|
| 2010/0202479 A1 | 8/2010 | Miyajima et al. | |
| 2011/0026551 A1 | 2/2011 | Stephens et al. | |
| 2011/0310921 A1 | 12/2011 | Chann et al. | |
| 2016/0218483 A1* | 7/2016 | Tayebati | H01S 5/02272 |
| 2017/0365978 A1 | 12/2017 | Lochman et al. | |
| 2018/0026416 A1 | 1/2018 | Kasahara et al. | |

* cited by examiner

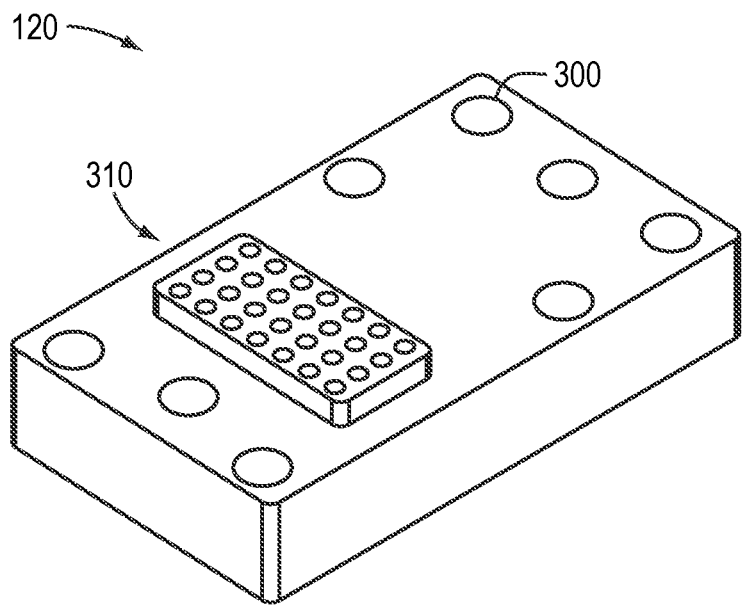
FIG. 3A
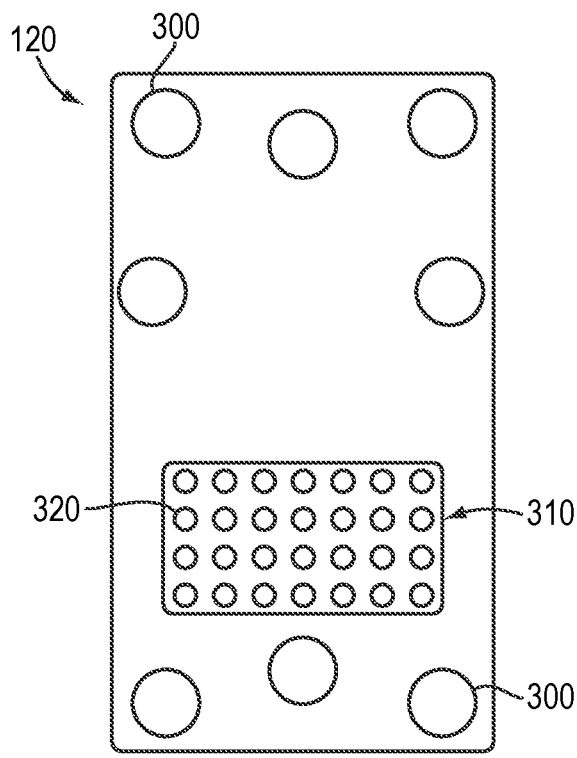 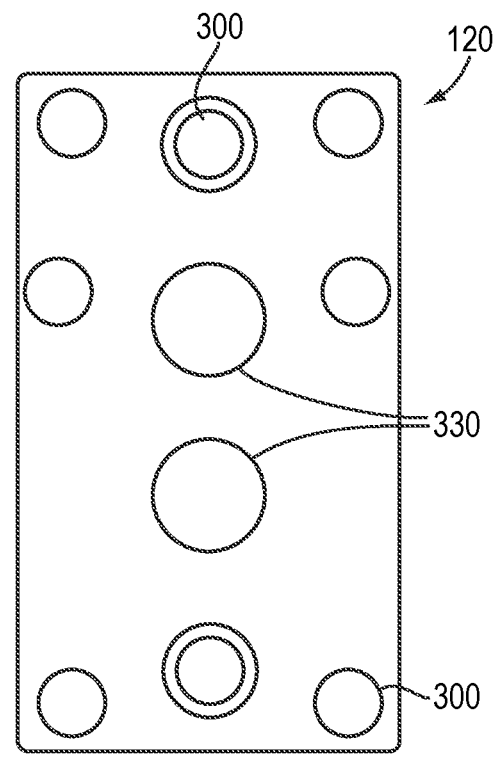
FIG. 3B  FIG. 3C

PACKAGES FOR HIGH-POWER LASER DEVICES

RELATED APPLICATIONS

This application is a continuation-in-part of U.S. patent application Ser. No. 15/627,917, filed Jun. 20, 2017, which claims the benefit of and priority to U.S. Provisional Patent Application No. 62/352,239, filed Jun. 20, 2016, the entire disclosure of each of which is hereby incorporated herein by reference.

TECHNICAL FIELD

In various embodiments, the present invention relates to laser devices such as laser diodes and laser diode bars, specifically apparatus for packaging such laser devices.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. Lasers for high-power laser systems have been packaged utilizing highly thermally conductive mounts that may define enclosed passages for the flow of cooling fluid therethrough, for example as described in U.S. Pat. No. 9,178,333, filed on Mar. 24, 2015, the entire disclosure of which is incorporated by reference herein. However, even such solutions may not fully address all of the thermal-management issues that arise in high-power laser systems. Moreover, packaging-related issues such as mechanical stability, stress, and corrosion (caused by, e.g., cooling fluid) may arise in high-power laser systems. Therefore, there is a need for improved packaging systems for high-power lasers that address the thermal, mechanical, and electrical needs for such devices.

SUMMARY

In accordance with embodiments of the present invention, laser emitters such as laser diode bars are utilized with a multi-component package engineered to improve the mechanical, thermal, and electrical performance of the device. Embodiments of the invention feature a two-piece anode cooler for the laser emitter; the two parts of the anode cooler are designed to optimize the efficacy of liquid cooling of the laser emitter while also resisting such deleterious effects as corrosion and mechanical deformation. Embodiments of the invention may also include an optional cathode cooler disposed over (and/or in thermal contact with and/or in direct mechanical contact with) the laser emitter to conduct away additional heat from the laser emitter and further improve the thermal characteristics of the device.

In various embodiments, the anode cooler includes, consists essentially of, or consists of a bottom anode cooler and, disposed thereover, a top anode cooler that makes direct contact with the laser emitter. The bottom anode cooler may include an active-cooling portion featuring an array of through-holes or nozzles that direct a cooling fluid (e.g., water) upward toward a receiving portion of the top anode cooler directly underlying the laser emitter. The impingement of the cooling fluid on this portion of the top anode cooler provides temperature control during operation of the laser emitter. The cooling enables a lower junction temperature of the laser emitter during operation, thereby providing improved reliability of the device and/or enabling operation of the laser emitter at high current levels for higher power output.

The underside of the receiving portion of the top anode cooler may be modified in order to improve the effectiveness of the cooling jets emerging from the bottom anode cooler and impinging upon the top anode cooler. For example, this impingement surface of the top anode cooler may be non-planar and/or textured or shaped so as to increase the area of contact through which convection occurs, accelerate the transition of the cooling fluid to a cooling turbulent flow, facilitate mixing and circulation of the cooling fluid, and/or disrupt any boundary layer in the cooling-fluid jets. For example, the impingement surface may incorporate a pattern of studs, grooves, and/or dimples in order to improve the thermal performance of the device. The top anode cooler may also incorporate strengthening struts that improve the mechanical strength of the top anode cooler (e.g., its resistance to mechanical deformation) while substantially maintaining the diminished thermal resistance created by the patterned impingement surface. Such struts may enable at least portions of the impingement surface to be quite thin, thereby improving the cooling of the overlying laser emitter. In various embodiments, the strengthening struts are formed in the bottom anode cooler. For example, struts may be formed and protrude above the through-holes or nozzles formed in the bottom anode cooler to form the cooling-fluid jets.

In various embodiments, the top and bottom anode coolers, or at least the portions thereof with which the cooling fluid comes into direct contact, include, consist essentially of, or consist of one or more materials that resist both erosion due to the moving cooling fluid and corrosion caused by reaction with the cooling fluid. For example, embodiments of the invention may utilize jets of cooling fluid traveling at velocities of approximately 10 m/s, or even higher, and such high-velocity fluid (e.g., water) may erode and/or corrode conventional heat-sink materials such as aluminum or copper. These materials are also preferably mechanically strong and rigid, to resist deformation during operation, packaging, and storage, as well as at least somewhat electrically conductive. The materials also preferably have coefficients of thermal expansion (CTEs) that substantially match those of the material of the laser emitter itself, e.g., GaAs (CTE of 6-8 ppm) or InP (CTE of 4-5 ppm). In various embodiments, the material of the top and/or bottom anode cooler has a CTE ranging from approximately 0.5 ppm to approximately 12 ppm, thereby enabling low cycle fatigue during operation of the laser device and low stress during the packaging process itself. In various embodiments, the material of the top and/or bottom anode cooler has a CTE ranging from approximately 0.5 ppm to approximately 4 ppm, or ranging from approximately 6 ppm to approximately 10 ppm. In various embodiments, one of the top or bottom anode coolers has a CTE ranging from approximately 0.5 ppm to approximately 4 ppm (or ranging between approximately 2 ppm and approximately 4 ppm), while the other one has a CTE ranging from approximately 6 ppm to approximately 10 ppm (or ranging between approximately 6 ppm and approximately 8 ppm).

In exemplary embodiments, all or portions of the top and/or bottom anode coolers include, consist essentially of, or consist of one or more materials such as an alloy of copper and tungsten (CuW), tungsten, tungsten carbide (WC), alumina, mullite, diamond, or silicon carbide (SiC) (e.g., single-crystal SiC). In various embodiments, all or portions of the top and/or bottom anode coolers include, consist essentially of, or consist of another material such as aluminum, copper, or stainless steel, and at least portions of the top and/or bottom anode coolers are coated with a coating of one or more materials such as CuW, tungsten, WC, alumina, mullite, diamond, or SiC. In various embodiments, the top anode cooler and the bottom anode cooler include, consist essentially of, or consist of different materials. For example, in various embodiments, the top anode cooler includes, consists essentially of, or consists of SiC, while the bottom anode cooler includes, consists essentially of, or consists of alumina. In various embodiments, the top and/or bottom anode cooler is electrically insulating.

As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, at least 200 $W \cdot m^{-1} \cdot K^{-1}$, at least 250 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohmmeter ($\Omega \cdot m$), at least $1 \times 10^{10}$ $\Omega \cdot m$, or even at least $1 \times 10^{12}$ $\Omega \cdot m$.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

As known to those of skill in the art, lasers are generally defined as devices that generate visible or invisible light through stimulated emission of light. Lasers generally have properties that make them useful in a variety of applications, as mentioned above. Common laser types include semiconductor lasers (e.g., laser diodes and diode bars), solid-state lasers, fiber lasers, and gas lasers. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 μm×100 μm. The beam quality along the 1 μm dimension or fast-axis is typically diffraction-limited. The beam quality along the 100 μm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

Embodiments of the present invention couple the one or more input laser beams (e.g., emitted by laser devices packaged as detailed herein) into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

In an aspect, embodiments of the invention feature a laser package including, consisting essentially of, or consisting of a bottom anode cooler and a top anode cooler. The bottom anode cooler defines at least partially therethrough a plurality of ports for forming jets of cooling fluid through the ports. The top anode cooler is disposed above the bottom anode cooler. The top anode cooler comprises or defines a laser platform for receiving a laser emitter thereon. The top anode cooler defines a recess therein. The recess is disposed beneath the laser platform. The recess has an impingement surface facing the ports of the bottom anode cooler, whereby cooling fluid introduced into the bottom anode cooler and jetted through the ports strikes the impingement surface of the top anode cooler to cool a laser emitter disposed on the laser platform.

Embodiments of the invention may include one or more of the following in any of a variety of combinations. At least a portion of the bottom anode cooler and/or the top anode cooler may include, consist essentially of, or consist of copper, aluminum, stainless steel, CuW, tungsten, WC (tungsten carbide), alumina, mullite, diamond, and/or SiC. At least a portion of the impingement surface may define a pattern (e.g., a raised and/or recessed texture, a roughness, and/or a set of raised and/or recessed shaped features) for enhancing a cooling effect of the jetted cooling fluid. The pattern may include, consist essentially of, or consist of a plurality of dimples, a plurality of grooves, and/or a plurality of studs. At least a portion of the impingement surface may define a plurality of struts for enhancing mechanical stability of the laser platform. The package may include a cathode cooler disposed over the top anode cooler. A portion of the cathode cooler may overhang and may not contact the laser platform of the top anode cooler. The ports may be spaced away from the impingement surface to form a mixing channel. The package may include, through the bottom anode cooler, (i) an inlet line for conducting the cooling fluid through the ports and into a proximal end of the mixing channel, and (ii) an outlet line for conducting the cooling fluid out of a distal end of the mixing channel. The mixing channel may have a height selected from the range of approximately 0.01 mm to approximately 30 mm. A center-to-center spacing of the ports may be selected from the range of approximately 0.1 mm to approximately 8 mm. A diameter (or other lateral dimension, such as width or length) of at least one of the ports may be selected from the range of approximately 0.025 mm to approximately 5 mm. A ratio of the height of the mixing channel to a diameter of at least one of the ports may be selected from the range of approximately 0.1 to approximately 30. A coefficient of thermal expansion of the top anode cooler and/or the bottom anode cooler may be selected from the range of approximately 0.5 ppm to approximately 12 ppm, or even approximately 3 ppm to approximately 10 ppm. The package may include a laser emitter disposed on the laser platform. The laser emitter may include or consist essentially of one or more diode bars each emitting and configured to emit a plurality of discrete beams (e.g., laser beams).

In another aspect, embodiments of the invention feature a wavelength beam combining laser system that includes, consists essentially of, or consists of a beam emitter, focusing optics, a dispersive element, a partially reflective output coupler, a bottom anode cooler, and a top anode cooler. The beam emitter emits a plurality of discrete beams (e.g., laser beams) and may have first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The second portion of the dispersed beams may propagate back to the beam emitter as feedback for the beams and to lock each beam to its individual wavelength. The wavelengths of the different beams may be different from each other. The bottom anode cooler defines at least partially therethrough a plurality of ports for forming jets of cooling fluid through the ports. The top anode cooler is disposed above the bottom anode cooler. The top anode cooler comprises or defines a laser platform for receiving the beam emitter thereon. The top anode cooler defines a recess therein. The recess is disposed beneath the laser platform. The recess has an impingement surface facing the ports of the bottom anode cooler, whereby cooling fluid introduced into the bottom anode cooler and jetted through the ports strikes the impingement surface of the top anode cooler to cool the beam emitter disposed on the laser platform.

Embodiments of the invention may include one or more of the following in any of a variety of combinations. The dispersive element may include, consist essentially of, or consist of a diffraction grating (e.g., a reflective grating or a transmissive grating). At least a portion of the impingement surface may define a pattern (e.g., a raised and/or recessed texture, a roughness, and/or a set of raised and/or recessed shaped features) for enhancing a cooling effect of the jetted cooling fluid. The pattern may include, consist essentially of, or consist of a plurality of dimples, a plurality of grooves, and/or a plurality of studs. At least a portion of the impingement surface may define a plurality of struts for enhancing mechanical stability of the laser platform. The package may include a cathode cooler disposed over the top anode cooler. A portion of the cathode cooler may overhang and may not contact the laser platform of the top anode cooler. A portion of the cathode cooler may be disposed over and be in thermal contact with the beam emitter.

In yet another aspect, embodiments of the invention feature a laser package that includes, consists essentially of, or consists of an anode cooler, a laser platform on the anode cooler for receiving a laser emitter, and a mixing channel between the anode cooler and the laser platform. The mixing channel includes an impingement surface in thermal contact with the laser platform and a jet array opposed across the mixing channel from the impingement surface. The jet array includes a plurality of ports for forming jets of cooling fluid therethrough, whereby cooling fluid introduced into the anode cooler and jetted through the ports strikes the impingement surface to cool a laser emitter disposed on the laser platform.

Embodiments of the invention may include one or more of the following in any of a variety of combinations. The mixing channel may be partially or substantially completely enclosed within the anode cooler. At least a portion of the anode cooler anode cooler may include, consist essentially of, or consist of copper, aluminum, stainless steel, CuW, tungsten, WC (tungsten carbide), alumina, mullite, diamond, and/or SiC. At least a portion of the impingement surface may define a pattern (e.g., a raised and/or recessed texture, a roughness, and/or a set of raised and/or recessed shaped features) for enhancing a cooling effect of the jetted cooling fluid. The pattern may include, consist essentially of, or consist of a plurality of dimples, a plurality of grooves, and/or a plurality of studs. At least a portion of the impingement surface may define a plurality of struts for enhancing mechanical stability of the laser platform. The package may include a cathode cooler disposed over the anode cooler. A portion of the cathode cooler may overhang and may not contact the laser platform of the anode cooler. The mixing channel may have a height selected from the range of approximately 0.01 mm to approximately 30 mm. A center-to-center spacing of the ports may be selected from the range of approximately 0.1 mm to approximately 8 mm. A diameter (or other lateral dimension, such as width or length) of at least one of the ports may be selected from the range of approximately 0.025 mm to approximately 5 mm. A ratio of the height of the mixing channel to a diameter of at least one of the ports may be selected from the range of approximately 0.1 to approximately 30. A coefficient of thermal expansion of the anode cooler may be selected from the range of approximately 0.5 ppm to approximately 12 ppm, or even approximately 3 ppm to approximately 10 ppm. The package may include a laser emitter disposed on the laser platform. The laser emitter may include or consist essentially of one or more diode bars each emitting and configured to emit a plurality of discrete beams (e.g., laser beams).

In another aspect, embodiments of the invention feature a wavelength beam combining laser system that includes, consists essentially of, or consists of a beam emitter, focusing optics, a dispersive element, a partially reflective output coupler, an anode cooler, a laser platform on the anode cooler for receiving the beam emitter, and a mixing channel between the anode cooler and the laser platform. The beam emitter emits a plurality of discrete beams (e.g., laser beams) and may have first and second opposed surfaces. The focusing optics focus the plurality of beams onto the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The second portion of the dispersed beams may propagate back to the beam emitter as feedback for the beams and to lock each beam to its individual wavelength. The wavelengths of the different beams may be different from each other. The mixing channel includes an impingement surface in thermal contact with the laser platform and a jet array opposed across the mixing channel from the impingement surface. The jet array includes a plurality of ports for forming jets of cooling fluid therethrough, whereby cooling fluid introduced into the anode cooler and jetted through the ports strikes the impingement surface to cool the beam emitter disposed on the laser platform.

Embodiments of the invention may include one or more of the following in any of a variety of combinations. The dispersive element may include, consist essentially of, or consist of a diffraction grating (e.g., a reflective grating or a transmissive grating). At least a portion of the impingement surface may define a pattern (e.g., a raised and/or recessed texture, a roughness, and/or a set of raised and/or recessed shaped features) for enhancing a cooling effect of the jetted cooling fluid. The pattern may include, consist essentially of, or consist of a plurality of dimples, a plurality of grooves, and/or a plurality of studs. At least a portion of the impingement surface may define a plurality of struts for enhancing mechanical stability of the laser platform. The package may include a cathode cooler disposed over the anode cooler. A portion of the cathode cooler may overhang and may not contact the laser platform. A portion of the cathode cooler may be disposed over and be in thermal contact with the beam emitter.

In an aspect, embodiments of the invention feature a laser package including, consisting essentially of, or consisting of a bottom anode cooler and a top anode cooler. The bottom anode cooler has (i) a top surface, (ii) a bottom surface opposite the top surface, (iii) an entry recess defined in the bottom surface, (iv) a top recess defined in the top surface, and (v) fluidly connecting the entry recess and the top recess, a plurality of hollow ports for forming jets of cooling fluid therethrough. The top anode cooler is disposed above the bottom anode cooler. The top anode cooler may be in direct mechanical contact with the bottom anode cooler. The top anode cooler may be directly attached to the bottom anode cooler via an attachment material. The top anode cooler has (i) a top surface and (ii) an impingement surface opposite the top surface. The impingement surface defines a non-planar pattern protruding into the top recess of the bottom anode cooler, whereby cooling fluid introduced into the bottom anode cooler and jetted through the ports strikes the impingement surface of the top anode cooler to cool a laser emitter disposed on the top surface of the top anode cooler.

Embodiments of the invention may include one or more of the following in any of a variety of combinations. At least a portion of the bottom anode cooler and/or the top anode cooler may include, consist essentially of, or consist of copper, aluminum, stainless steel, CuW, tungsten, WC (tungsten carbide), alumina, mullite, diamond, and/or SiC. The non-planar pattern may include, consist essentially of, or consist of a plurality of raised features. The bottom anode cooler may define a plurality of raised struts disposed between openings of the ports. The package may include a cathode cooler disposed over the top anode cooler. A portion of the cathode cooler may overhang and may not contact the top surface of the top anode cooler. The cathode cooler may not be configured for the flow of cooling fluid therethrough. The top anode cooler may not be configured for the flow of cooling fluid therethrough.

The non-planar pattern may be spaced away from openings of the ports to form a mixing channel for the cooling fluid. The mixing channel may have a height selected from the range of approximately 0.025 mm to approximately 50 mm. A ratio of the height of the mixing channel to a diameter of at least one of the ports may be selected from the range of approximately 0.1 to approximately 30. A ratio of the height of the mixing channel to a diameter of at least one of the ports may be selected from the range of approximately 8 to approximately 30. A ratio of the height of the mixing channel to a diameter of at least one of the ports may be selected from the range of approximately 0.1 to approximately 2. A center-to-center spacing of the ports may be selected from the range of approximately 0.1 mm to approximately 8 mm. A diameter (or other lateral dimension, such as width or length) of at least one of the ports may be selected from the range of approximately 0.025 mm to approximately 5 mm. An area, a length, and/or a width of the top surface of the top anode cooler may be smaller than an area, a length, and/or a width of the top surface of the bottom anode cooler. The bottom anode cooler may define therewithin an exit channel fluidly connecting the top recess with an exit aperture defined in the bottom surface of the bottom anode cooler and spaced away from the entry recess. An attachment material may attach a portion (e.g., at least some of a peripheral portion) of the bottom surface of the top anode cooler to a portion of the top surface of the bottom anode cooler. The attachment material may include, consist essentially of, or consist of an adhesive, solder, and/or a brazing material. A coefficient of thermal expansion of the top anode cooler and/or the bottom anode cooler may be selected from the range of approximately 0.5 ppm to approximately 12 ppm. The bottom anode cooler may include, consist essentially of, or consist of alumina and/or the top anode cooler may include, consist essentially of, or consist of SiC. The package may include a laser emitter disposed on the laser platform. The laser emitter may include, consist essentially of, or consist of one or more diode bars each emitting and configured to emit a plurality of discrete beams (e.g., laser beams).

In another aspect, embodiments of the invention feature a wavelength beam combining laser system that includes, consists essentially of, or consists of a beam emitter, focusing optics, a dispersive element, a partially reflective output coupler, a bottom anode cooler, and a top anode cooler. The beam emitter emits a plurality of discrete beams (e.g., laser beams) and may have first and second opposed surfaces. The focusing optics focus and/or converge the plurality of beams toward the dispersive element. The distance between the dispersive element and the focusing optics may approximately correspond to a focal length of the focusing optics (in other embodiments, this distance is less than or greater than the focal length of the focusing optics). The dispersive element receives and disperses the received focused beams. The partially reflective output coupler is positioned to receive the dispersed beams, transmit a portion of the dispersed beams therethrough (i.e., through the output coupler, e.g., toward a workpiece to be processed with or subjected to the multi-wavelength beam) as a multi-wavelength output beam, and reflect a second portion of the dispersed beams back toward the dispersive element. The second portion of the dispersed beams may propagate back to the beam emitter as feedback for the beams and to lock each beam to its individual wavelength. The wavelengths of the different beams may be different from each other. The bottom anode cooler has (i) a top surface, (ii) a bottom surface opposite the top surface, (iii) an entry recess defined in the bottom surface, (iv) a top recess defined in the top surface, and (v) fluidly connecting the entry recess and the top recess, a plurality of hollow ports for forming jets of cooling fluid therethrough. The top anode cooler is disposed above the bottom anode cooler. The top anode cooler may be in direct mechanical contact with the bottom anode cooler. The top anode cooler may be directly attached to the bottom anode cooler via an attachment material. The top anode cooler has (i) a top surface and (ii) an impingement surface opposite the top surface. The beam emitter is disposed over or on the top surface of the top anode cooler. The impingement surface defines a non-planar pattern protruding into the top recess of the bottom anode cooler, whereby cooling fluid introduced into the bottom anode cooler and jetted through the ports strikes the impingement surface of the top anode cooler to cool the beam emitter.

Embodiments of the invention may include one or more of the following in any of a variety of combinations. The dispersive element may include, consist essentially of, or consist of a diffraction grating (e.g., a reflective grating or a transmissive grating). At least a portion of the bottom anode cooler and/or the top anode cooler may include, consist essentially of, or consist of copper, aluminum, stainless steel, CuW, tungsten, WC (tungsten carbide), alumina, mullite, diamond, and/or SiC. The non-planar pattern may include, consist essentially of, or consist of a plurality of raised features. The bottom anode cooler may define a plurality of raised struts disposed between openings of the ports. The laser system may include a cathode cooler disposed over the top anode cooler. A portion of the cathode cooler may overhang and may not contact the top surface of the top anode cooler. The cathode cooler may not be configured for the flow of cooling fluid therethrough. The top anode cooler may not be configured for the flow of cooling fluid therethrough.

The non-planar pattern may be spaced away from openings of the ports to form a mixing channel for the cooling fluid. The mixing channel may have a height selected from the range of approximately 0.025 mm to approximately 50 mm. A ratio of the height of the mixing channel to a diameter of at least one of the ports may be selected from the range of approximately 0.1 to approximately 30. A ratio of the height of the mixing channel to a diameter of at least one of the ports may be selected from the range of approximately 8 to approximately 30. A ratio of the height of the mixing channel to a diameter of at least one of the ports may be selected from the range of approximately 0.1 to approximately 2. A center-to-center spacing of the ports may be selected from the range of approximately 0.1 mm to approximately 8 mm. A diameter (or other lateral dimension, such as width or length) of at least one of the ports may be selected from the range of approximately 0.025 mm to approximately 5 mm. An area, a length, and/or a width of the top surface of the top anode cooler may be smaller than an area, a length, and/or a width of the top surface of the bottom anode cooler. The bottom anode cooler may define therewithin an exit channel fluidly connecting the top recess with an exit aperture defined in the bottom surface of the bottom anode cooler and spaced away from the entry recess. An attachment material may attach a portion (e.g., at least some of a peripheral portion) of the bottom surface of the top anode cooler to a portion of the top surface of the bottom anode cooler. The attachment material may include, consist essentially of, or consist of an adhesive, solder, and/or a brazing material. A coefficient of thermal expansion of the top anode cooler and/or the bottom anode cooler may be selected from the range of approximately 0.5 ppm to approximately 12 ppm. The bottom anode cooler may include, consist essentially of, or consist of alumina and/or the top anode cooler may include, consist essentially of, or consist of SiC. The beam emitter may include or consist essentially of one or more diode bars.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3A-3C are, respectively, a perspective view, a top view, and a bottom view of a bottom anode cooler in accordance with embodiments of the invention;

DETAILED DESCRIPTION

Figure 1:
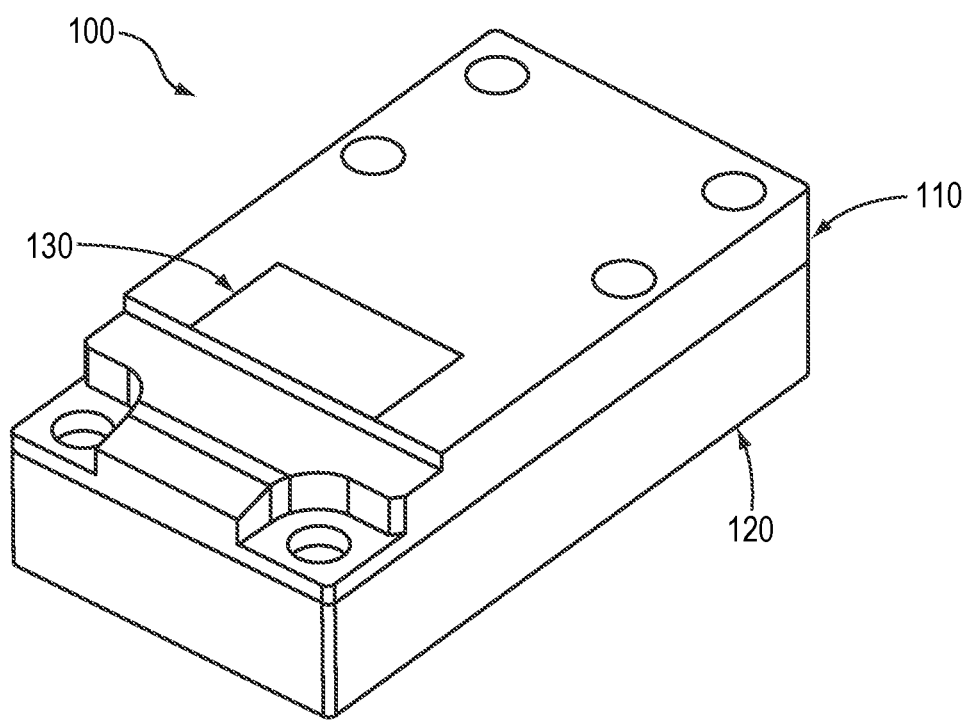
FIG. 1 is a perspective view of a two-piece anode cooler for a laser emitter in accordance with embodiments of the invention.

FIG. 1 depicts a two-part anode cooler 100 in accordance with embodiments of the invention. As shown, the cooler 100 includes, consists essentially of, or consists of a top anode cooler 110 situated atop a bottom anode cooler 120. The top anode cooler 110 typically features a platform 130 upon which the laser emitter (not shown for clarity) is disposed. The platform 130 may be sized and shaped to accommodate a desired laser emitter (e.g., a diode bar). As shown, the platform 130 may be slightly elevated above other portions of the top anode cooler in the intended emission direction of the laser emitter. In other embodiments, the top surface of the top anode cooler 110 is substantially planar, and the platform 130 is a portion of that planar surface. The top anode cooler 110 may also be fastened, at least during operation, to the bottom anode cooler 120 via one or more screws or other fasteners. In other embodiments, the top and bottom anode coolers 110, 120 are attached together utilizing a technique such as, for example, welding, soldering, or brazing, thereby forming a unitary, one-piece anode cooler. In such embodiments, the top anode cooler 110 may not define therethrough holes or openings for receiving screws or other fasteners. In yet other embodiments, the top and bottom anode coolers 110, 120 may be replaced by a single-piece anode cooler having the features of the top and bottom anode coolers 110, 120 detailed herein; such single-piece coolers may be machined from a solid piece of metal. As such, references herein to "top anode cooler" and "bottom anode cooler" may be considered, in various embodiments, to refer to corresponding portions of a unitary "anode cooler" that is either machined from a single piece of material or fabricated as multiple pieces that are fastened together substantially permanently (e.g., by welding, soldering, or brazing or the like).

As described in more detail below, the bottom anode cooler 120 incorporates an array of cooling jets through which cooling fluid (e.g., water) flows, impinging upon an impingement surface on the top anode cooler 110 directly below the laser emitter. The jets of cooling fluid cool the laser emitter, thereby improving performance and reliability and/or enabling higher-current (and therefore higher-power) operation. All or portions of the top anode cooler 110 and/or the bottom anode cooler 120 may include, consist essentially of, or consist of one or more materials such as copper, CuW, tungsten, alumina, mullite, diamond, SiC, and/or WC. In various embodiments, all or portions of the top and/or bottom anode coolers 110, 120 include, consist essentially of, or consist of another material such as aluminum, copper, or stainless steel, and at least portions of the top and/or bottom anode coolers 110, 120 are coated with a coating of one or more materials such as CuW, tungsten, WC, alumina, mullite, diamond, SiC, or one or more other coating materials resistant to fluid-induced corrosion and/or erosion. All or portions of the top anode cooler 110 and/or the bottom anode cooler 120 may be electrically insulating.

All or portions of the top anode cooler 110 and/or the bottom anode cooler 120 may include, consist essentially of, or consist of different materials. For example, in various embodiments, the top anode cooler 110 includes, consists essentially of, or consists of SiC (e.g., single-crystal SiC), while the bottom anode cooler 120 includes, consists essentially of, or consists of alumina. The use of different materials for the top and bottom anode coolers may provide one or more advantages in various embodiments of the invention. For example, in various embodiments, it is desirable that the top anode cooler 110 have a high thermal conductivity while the bottom anode cooler 120 have a lower thermal conductivity. (For example, in various embodiments, the thermal conductivity (which may depend on temperature) of a single-crystal SiC cooler ranges between 300 and 400 $W \cdot m^{-1} \cdot K^{-1}$, or even higher (e.g., up to approximately 500 $W \cdot m^{-1} \cdot K^{-1}$), while the thermal conductivity of an alumina cooler may range between 5 and 30 $W \cdot m^{-1} \cdot K^{-1}$.) In various embodiments, the thermal conductivity of the top anode cooler 110 is greater than the thermal conductivity of the bottom anode cooler 120 by a factor of 2 or more, a factor of 5 or more, or even a factor of 10 or more.

In various embodiments, the top anode cooler 110 includes, consists essentially of, or consists of a semiconductor material and/or a material having high electrical resistance in order to, for example, prevent electrochemical corrosion effects in the attachment between the top and bottom anode coolers (which, in various embodiments, may include, consist essentially of, or consist of a braze or solder joint attachment). The top anode cooler 110 may also desirably have high mechanical strength to enable its thickness to be reduced or minimized to maximize the cooling effect of the cooling fluid while maintaining resistance to bending from the pressure of the cooling fluid below the top anode cooler 110. Such bending could result in "smile" defects in the laser device.

As mentioned above, in various embodiments the bottom anode cooler 120 includes, consists essentially of, or consists of a material having a low thermal conductivity. The low thermal conductivity of the bottom anode cooler 120 may prevent bending or deformation (and resulting power instability) of the laser device resulting from the low temperature of the cooling fluid. In various embodiments of the invention, the bottom anode cooler 120 includes, consists essentially of, or consists of a ceramic material, as may such materials may be formed into complex shapes via, e.g., injection molding or additive manufacturing techniques such as three-dimensional printing.

Figure 2:
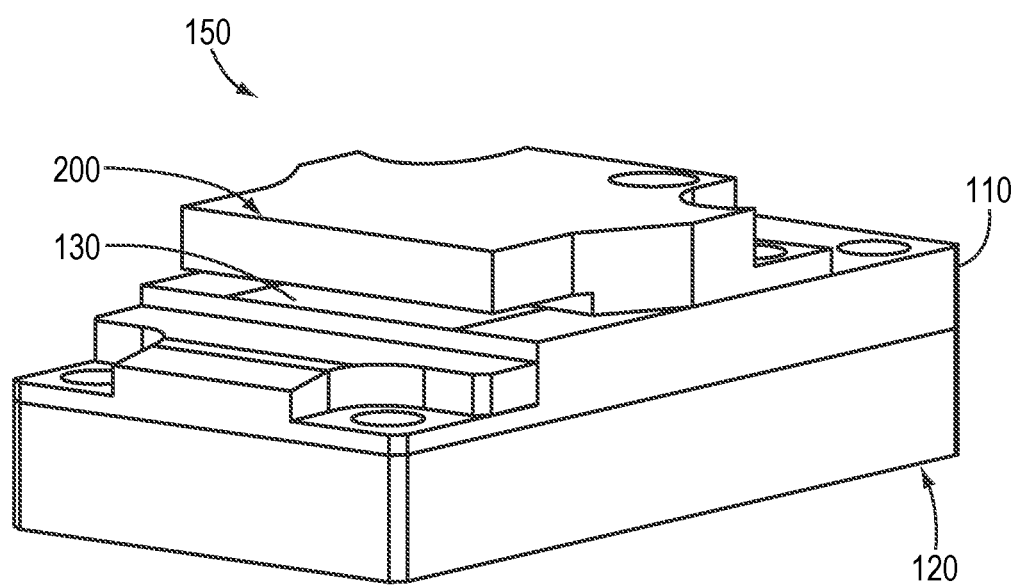
FIG. 2 is a perspective view of a laser package incorporating the two-piece anode cooler of FIG. 1 and a cathode cooler in accordance with embodiments of the invention.

FIG. 2 depicts a laser package 150 that incorporates the two-part anode cooler 100 of FIG. 1 and adds a cathode cooler 200 disposed over the top anode cooler 110 and the laser emitter platform 130 (and thus, in operation, at least a portion of the laser emitter itself). The cathode cooler 200 may improve the thermal performance of the packaged device by conducting additional heat away from the laser emitter. The cathode cooler 200 may also improve the mechanical stability of the packaged device, thereby minimizing or substantially eliminating deformation of the laser emitter during packaging, burn-in, and/or operation. The cathode cooler 200 may cool passively or may incorporate one or more internal channels to conduct cooling fluid therethrough. That is, while in some embodiments the cathode cooler 200 may be configured to conduct cooling fluid therethrough, in other embodiments, the cathode cooler 200 may be solid and configured not to accept or conduct cooling fluid therethrough. In various embodiments, the cathode cooler 200 is configured not to accept a laser emitter thereon, i.e., the cathode cooler 200 may not incorporate a laser emitter platform and may not be sized, shaped, and/or configured for the attachment of another laser emitter thereon. As shown, the cathode cooler 200 may have top and/or bottom surfaces that are smaller in area, length and/or width than that of the bottom anode cooler 120. That is, in various embodiments, the cathode cooler 200 does not overlie the entirety of (and/or has a size different from) the bottom anode cooler 120 and/or the top anode cooler 110.

The cathode cooler 200 may include, consist essentially of, or consist of one or more of the materials specified above for the top and bottom anode coolers 110, 120 or may include, consist essentially of, or consist of one or more additional materials (e.g., aluminum, copper, stainless steel) coated with one or more of the materials specified for the top and bottom anode coolers 110, 120 or with one or more other materials. In other embodiments, the cathode cooler 200 may include, consist essentially of, or consist of copper (e.g., uncoated copper).

FIGS. 3A, 3B, and 3C are, respectively, a perspective view, a top view, and a bottom view of a bottom anode cooler 120 in accordance with various embodiments of the invention. As shown, the bottom anode cooler 120 may be generally rectilinear and may feature one or more through-holes 300 for connection of the bottom anode cooler 120 to the top anode cooler 110 and/or to an underlying substrate or mount or other hardware in a laser system. At least a portion 310 of the top surface of the bottom anode cooler 120 defines an array of openings (or "ports") 320 through which cooling fluid is directed toward the top anode cooler 110—this portion of the bottom anode cooler 110 is also referred to herein as the "active-cooling portion" 310. The openings 320 may be substantially cylindrical, and the cross-sectional area of the openings 320 may be substantially constant through their thickness. In other embodiments, the sidewall of one or more of the openings 320 tapers to form a nozzle. In various embodiments, the center-to-center spacing of the openings 320 ranges from approximately 0.1 mm to approximately 8 mm. In various embodiments, the diameter (or other lateral dimension, e.g., width, in embodiments featuring non-circular openings) of the openings 320 ranges from approximately 0.025 mm to approximately 5 mm. The active-cooling portion 310 of the bottom anode cooler 120 may be substantially rectangular and may be substantially flush with the remaining portion of the top surface of the bottom anode cooler 120. In other embodiments, as shown in FIG. 3A, the active-cooling portion 310 extends upward from the remaining portion of the top surface of the bottom anode cooler 120 by, e.g., approximately 0.1 mm to approximately 5 mm. In yet other embodiments, the active-cooling portion (at least the openings 320) are recessed below the remaining portion of the top surface of the bottom anode cooler 120 by, e.g., approximately 0.025 mm to approximately 50 mm.

The bottom anode cooler 120 also features passages 330 for the inlet and egress of cooling fluid that flows through the bottom anode cooler 120, through the active-cooling portion 310 toward the top anode cooler 110 (as discussed in more detail below), and back out of the bottom anode cooler 120 (via, e.g., one or more openings proximate the perimeter of the active-cooling portion). In operation, the flow of cooling fluid into, through, and out of bottom anode cooler 120 may be pulsed or substantially continuous.

Figure 4:
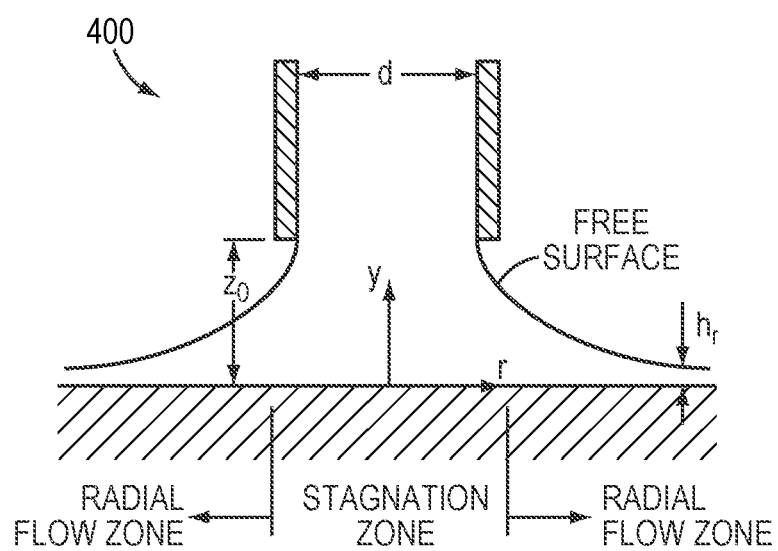
FIG. 4 is a schematic diagram of a fluid jet formed by an opening in a bottom anode cooler in accordance with embodiments of the invention.

FIG. 4 depicts a schematic of a single cooling fluid jet 400 formed by one of the openings 320 in the bottom anode cooler 120, in which the end of the nozzle (which faces upwards in embodiments of the present invention but faces down in FIG. 4) is spaced away from the impingement surface toward which the cooling fluid flows (e.g., at least a portion of the impingement surface of the top anode cooler) by a distance $z_0$. This distance $z_0$ between the openings 320 and the impingement surface defines the height of a "mixing channel" formed between the bottom anode cooler 120 and the top anode cooler 110 in which cooling fluid is jetted from openings 320 to cool the impingement surface (and thus the laser emitter disposed thereon). In various embodiments, the mixing channel may be considered to also include the impingement surface. The nozzle has a diameter d. In accordance with various embodiments of the invention, the ratio of $z_0$ to d is selected to be between approximately 0.1 and approximately 30, between approximately 0.1 and approximately 2, between approximately 0.1 and approximately 1, between approximately 1 and approximately 2, between approximately 8 and approximately 30, between approximately 8 and approximately 10, between approximately 10 and approximately 30, between approximately 15 and approximately 30, or between approximately 20 and approximately 30. Such ratios of nozzle distance to nozzle diameter have been found, in various embodiments, to improve thermal performance of the cooling fluid via turbulence generated from the jet flowing through the nozzle; ratios outside of this range may result in insufficient turbulence, mixing, and cooling action of the cooling fluid. In various embodiments, the active-cooling portion features a plurality of different openings 320. In such embodiments, the spacing between openings 320 may result in mixing of the cooling fluid jetted from each opening sufficient to minimize or substantially eliminate the stagnation zones of the jets (as depicted in FIG. 4). That is, turbulent and/or mixing cooling fluid from neighboring jets may improve the cooling action from a jet, and vice versa.

Figure 5A:
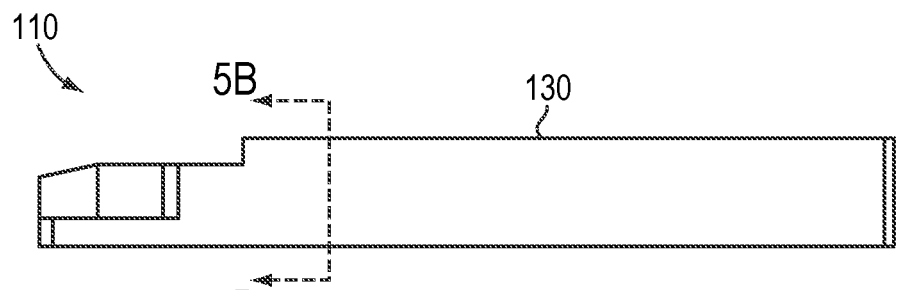
FIG. 5A is a side view of a top anode cooler in accordance with embodiments of the invention.
Figure 5B:
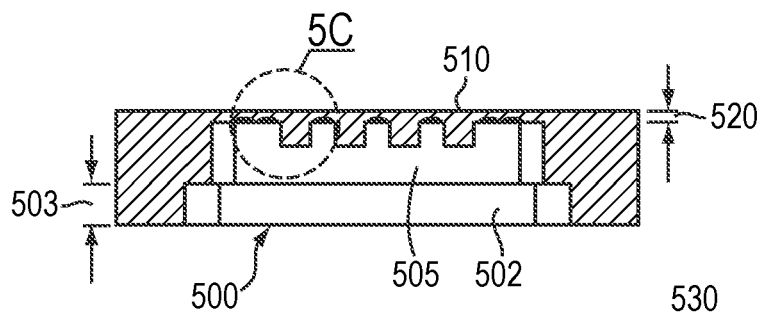
FIG. 5B is a sectional view of the top anode cooler of FIG. 5A.
Figure 5C:
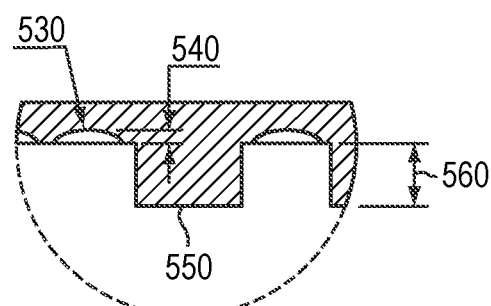
FIG. 5C is an enlarged portion of the sectional view of FIG. 5B.
Figure 5D:
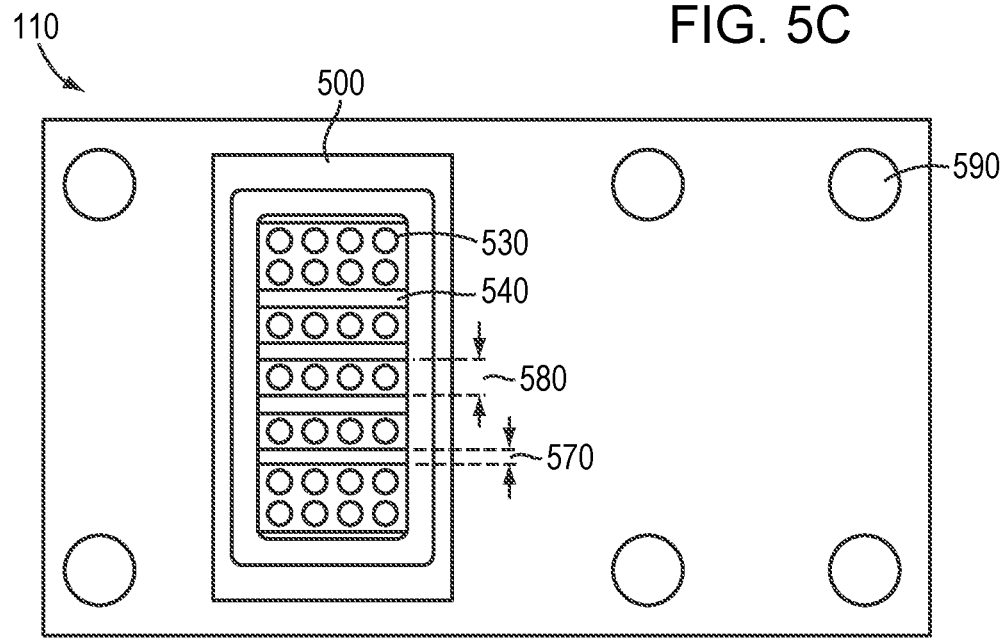
FIG. 5D is a bottom view of the top anode cooler of FIG. 5A.

FIGS. 5A and 5D are, respectively, a side view and a bottom view of a top anode cooler 110 in accordance with various embodiments of the invention. As indicated, FIG. 5B is a sectional view through line 5B-5B on the view of FIG. 5A, and FIG. 5C is an enlarged view of a portion of FIG. 5B. As shown, the top anode cooler 110 has a generally planar top platform 130 for supporting the laser emitter. Below the laser emitter platform 130, the top anode cooler 110 may define a recess 500 for receiving the active-cooling portion 310 of the bottom anode cooler 120 when the top and bottom anode coolers are affixed together. The recess 510 may have a lower portion 502 sized and shaped to accommodate all or a portion of the active-cooling portion 310 of the bottom anode cooler 120. In various embodiments, the thickness 503 of the lower portion 520 is approximately equal to the height that active-cooling portion 310 protrudes above the remaining portion of the top surface of the bottom anode cooler 120. The recess 510 may also have an upper portion 505 for receiving the cooling-liquid jets produced by the active-cooling portion 310.

At least a portion of the upper surface of the recess 500 forms an impingement surface 510 for receiving the jets of cooling fluid directed upward by the active-cooling portion 310 of the bottom anode cooler 120. The spacing 520 between the impingement surface 510 and the top surface of the top anode cooler 110 (on which the laser emitter is disposed) is typically quite small to thereby enhance the cooling efficacy of the jets. In various embodiments, this spacing 520 ranges from approximately 0.1 mm to approximately 5 mm.

As shown in FIGS. 5B and 5C, at least a portion of the impingement surface 510 of the top anode cooler 110 may be modified (i.e., shaped) in order to enhance the cooling effect of the jets directed thereon. For example, the impingement surface 510 may define one or more dimples 530 directed upward toward the laser emitter, effectively creating thinned, shaped regions of the impingement surface 510. In other embodiments, the dimples 530 may be directed downward away from the laser emitter. The dimples 530 (or other shapes) may have heights 540 of, for example, between 0.001 mm and 1.8 mm. While the dimples 530 are depicted in FIG. 5D as circular and distributed in a regular pattern, in various embodiments the dimples 530 may have other shapes, may have a variety of different shapes within a single top anode cooler 110, and may be distributed and/or spaced in any of a variety of different spacings or geometries.

The impingement surface 510 may also define one or more struts 550 extending across the width of the recess in the top anode cooler 110. The struts 550 are defined by a portion of the top anode cooler 110 having a thickness 560 greater than the thickness of one or more surrounding portions of the top anode cooler 110 (which may, e.g., be shaped or otherwise thinned to improve thermal performance of the cooling fluid jets). In various embodiments, the presence of one or more struts 550 in the recess 500 in the top anode cooler 110 improves the mechanical strength (e.g., resists deformation) of the top anode cooler 110 during assembly and/or operation of the laser emitter. In accordance with various embodiments, the struts 550 may have strut heights 560 (i.e., distances of extent above surrounding portions of the impingement surface) that range from approximately 0.01 mm to approximately 6.2 mm. The struts 550 may have strut widths 570 ranging from approximately 0.045 mm to approximately 6 mm. In various embodiments, the spacing 580 between neighboring struts may range from approximately 0.25 mm to approximately 3.6 mm. While the struts 550 are depicted in FIG. 5D as being rectangular and having constant widths, in various embodiments, the struts 550 may have other shapes. In various embodiments, the top anode cooler 110 does not incorporate struts 550. As shown in FIG. 5D, the top anode cooler 110 may also feature one or more through-holes 590 to facilitate joining of top anode cooler 110 and bottom anode cooler 120. In various embodiments, one or more struts 550 may be formed in the bottom anode cooler 120 in addition to, or instead of, being formed in the top anode cooler 110.

Figure 6A:
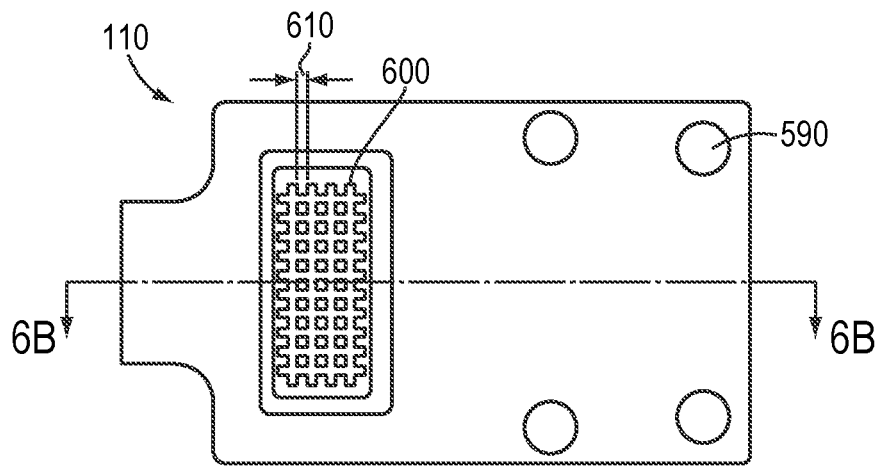
FIG. 6A is a bottom view of a top anode cooler in accordance with embodiments of the invention.
Figure 6B:
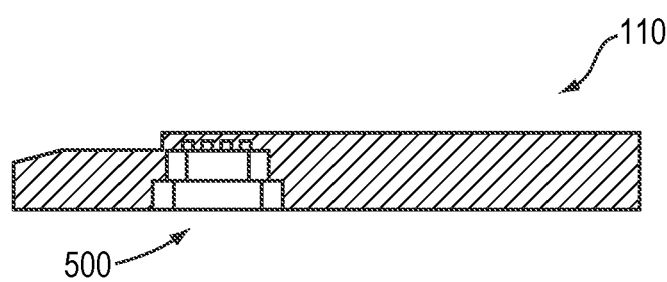
FIG. 6B is a sectional view of the top anode cooler of FIG. 6A.
Figure 6C:
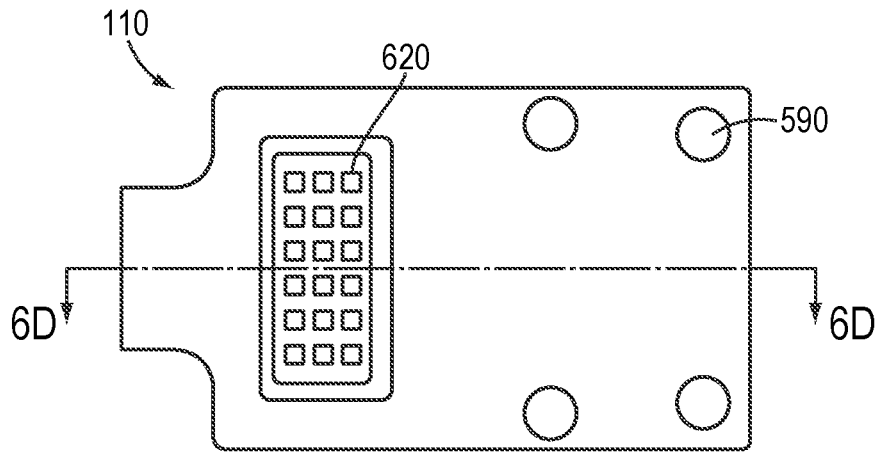
FIG. 6C is a bottom view of a top anode cooler in accordance with embodiments of the invention.
Figure 6D:
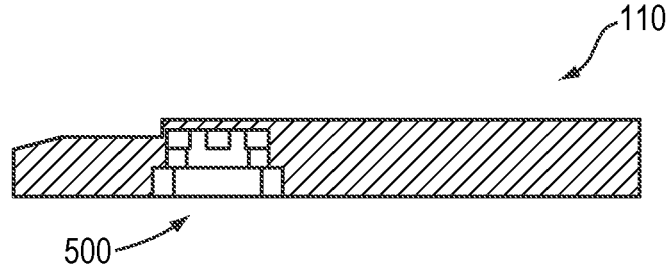
FIG. 6D is a sectional view of the top anode cooler of FIG. 6C.

FIGS. 6A and 6C are bottom views of additional example embodiments of top anode coolers 110 in accordance with additional embodiments of the present invention. As indicated, FIG. 6B is a sectional view of FIG. 6A along line 6B-6B, and FIG. 6D is a sectional view of FIG. 6C along line 6D-6D. As shown in FIG. 6A, the impingement surface 510 of the top anode cooler 100 may be modified to form a pattern of recessed grooves 600 spaced apart at a spacing 610. In various embodiments, the spacing 610 may range between approximately 0.01 mm and approximately 2.8 mm. As shown in FIG. 6C, the impingement surface 510 of the top anode cooler 100 may be modified to form a pattern of elevated (i.e., away from the top surface of top anode cooler 110) studs 620. As shown, the studs 620 may be substantially square or rectangular in cross-section and may be arranged in a regular pattern or grid. In other embodiments, all or some of the studs 620 may have other cross-sectional shapes (e.g., circular, polygonal, etc.). In various embodiments, the size of one or more of the studs 620 may vary along its thickness (i.e., height). For example, the size of one or more of the studs 620 may increase or decrease in the direction away from the laser platform 130. The width (or other lateral dimension) of each stud 620 may range between, for example, 0.1 mm and 5 mm. The spacing between adjacent studs 620 may range between, for example, 0.1 mm and 5 mm. The embodiments of FIGS. 6A and 6C may also feature one or more struts 550 as described above and as shown in FIGS. 5B-5D.

Figure 7:
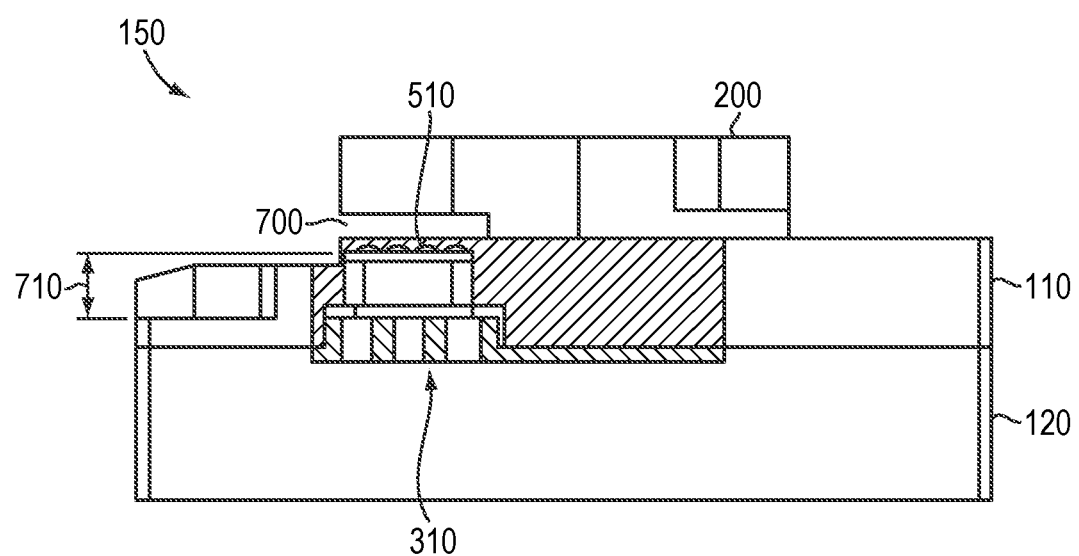
FIG. 7 is a side/sectional view of a laser package in accordance with embodiments of the invention.

FIG. 7 is a sectional/side view of an assembled laser package 150 in accordance with embodiments of the present invention and corresponding to the perspective view of FIG. 2. As shown, the laser package 150 features the top and bottom anode coolers 110, 120 as well as an overlying cathode cooler 200. The cathode cooler 200 and the top anode cooler define therebetween an opening 700 for receiving the laser emitter therein; when received in the opening, the laser emitter is cooled via the cooling fluid jets emerging from the bottom anode cooler 120 and striking the impingement surface 510 of the top anode cooler 110. As indicated on FIG. 7, the distance 710 between the impingement surface 510 of the top anode cooler 110 and the upper surface of active-cooling portion 310 of the bottom anode cooler 120 corresponds to the distance $z_0$ discussed above and depicted in FIG. 4.

Figure 8A:
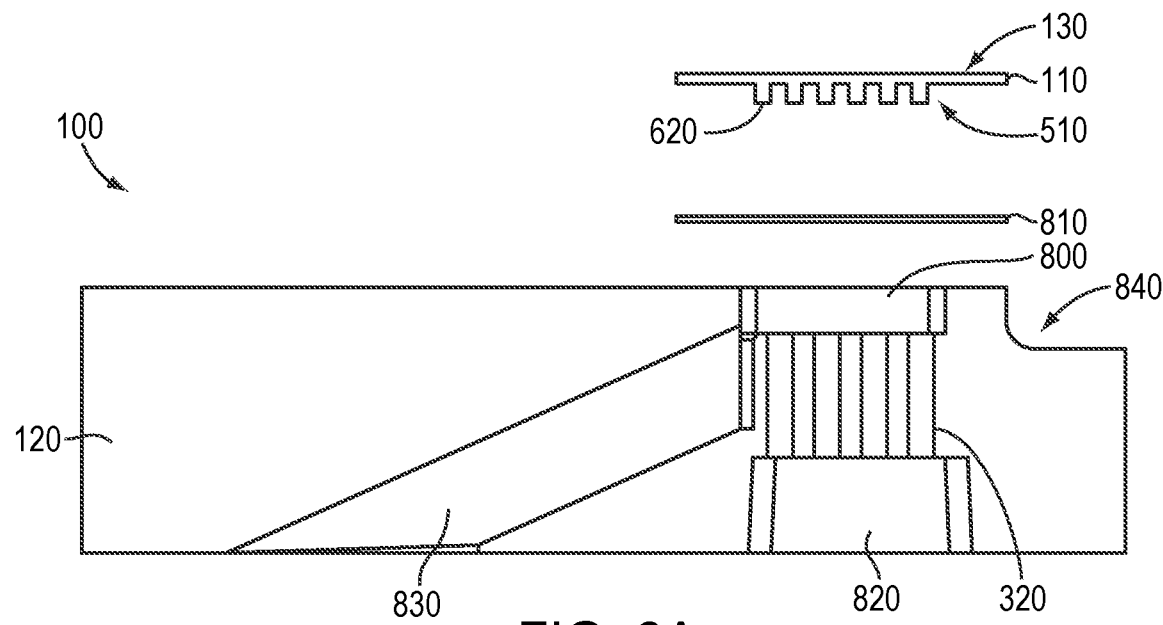
FIG. 8A is an exploded cross-sectional view of a two-piece anode cooler for a laser emitter in accordance with embodiments of the invention.
Figure 8B:
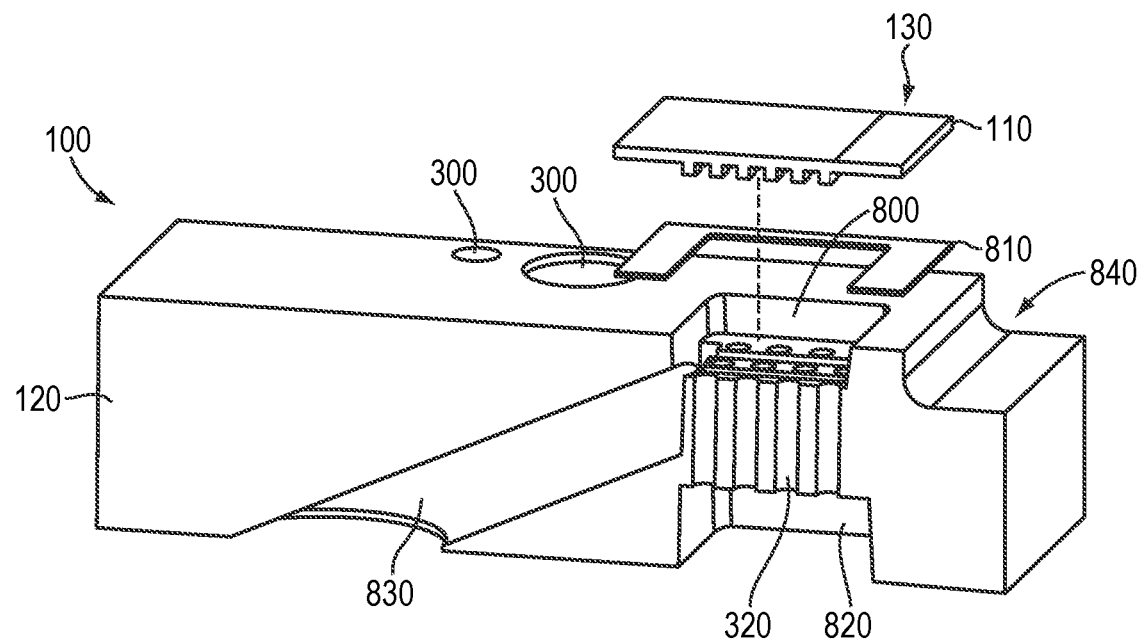
FIG. 8B is an exploded sectional view of a two-piece anode cooler for a laser emitter in accordance with embodiments of the invention.
Figure 8C:
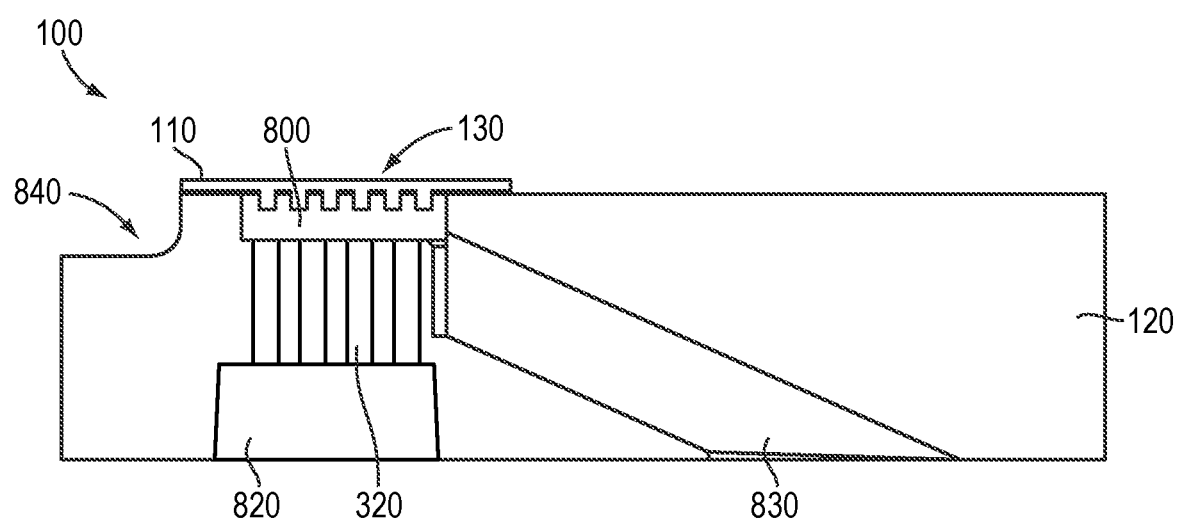
FIG. 8C is a cross-sectional view of a two-piece anode cooler for a laser emitter in accordance with embodiments of the invention.

FIGS. 8A-8C depict another two-part anode cooler 100 in accordance with various embodiments of the invention. As shown, in various embodiments the top anode cooler 110 may not define a recess therein. Instead, as shown in FIGS. 8A-8C, the top and bottom surfaces of the top anode cooler 110 may be substantially planar except for the impingement surface 510, which may feature a plurality of protruding features such as an array of studs 620. That is, all or a portion of the top surface of the top anode cooler 110 may be the laser platform 130, and the laser platform 130 may be substantially coplanar with any other portion of the top surface of the top anode cooler 110. In such embodiments, the top anode cooler 110 may be configured (e.g., sized and shaped) to cover and/or seal a recess 800 defined in the bottom anode cooler 120 above top openings of the cooling-fluid ports 320. In various embodiments, the length and/or width of the recess 800 (e.g., at the top surface of the bottom anode cooler 120) may range from, for example, approximately 0.5 mm to approximately 50 mm, or approximately 3 mm to approximately 50 mm. In various embodiments, the length of the top of the recess 800 is different from the width thereof, while in other embodiments the length and width are approximately equal to each other.

In various embodiments, the top anode cooler 110 may be attached to the bottom anode cooler 120 via an attachment material 810, which may include, consist essentially of, or consist of, for example, an adhesive, solder, and/or a brazing material. In other embodiments, as shown in earlier figures, the top anode cooler 110 may be attached to the bottom anode cooler 120 via one or more screws or other fasteners. (As shown in FIG. 8B, the top surface of the top anode cooler 110 may also incorporate an attachment material thereon for attachment of the laser emitter thereto.)

As also shown in FIGS. 8A-8C, the bottom anode cooler 120 may define a lower recess 820 for receiving cooling fluid (e.g., from an external reservoir or heat exchanger). The cooling fluid flows from the lower recess 820 into the ports 320 to form the cooling-fluid jets that impinge upon the impingement surface 510 of the top anode cooler 110. Thus, in various embodiments of the invention, the cooling-fluid ports fluidly connect the lower recess 820 to the upper recess 800. After the cooling fluid cools the laser emitter on the laser platform 130, it may flow out of the bottom anode cooler 120 via one or more exit channels 830. As shown, the exit channel 830 may only partially intersect the recess 800; i.e., the diameter (or width, or other lateral direction) of the exit channel 830 away from the recess 800 may be larger than the size of the terminal end of the exit channel 830 that actually fluidly connects the exit channel 830 with recess 800. In various embodiments, the cross-sectional area of the exit channel 830 is greater than or approximately equal to the sum of the cross-sectional areas of the ports 320, in order to accommodate the flow of cooling fluid therefrom. In various embodiments, the bottom anode cooler 120 may be mounted on and/or attached to a base platform (e.g., a base for multiple different anode cooler 120 each with a laser emitter thereon), and the lower recess 820 may be fluidly connected to a fluid source (e.g., a feed line or port in the base platform) while the exit channel 830 may be fluidly connected to a fluid sink (e.g., a fluid line or port in the base platform). The lower recess 820 and/or the exit channel 830 may be sealed to the base platform via, for example, o-rings or other sealing agents to prevent leakage of the cooling fluid. As shown in FIGS. 8A-8C, during cooling, the cooling fluid may flow into recess 800 at the bottom thereof (i.e., from the ports 320) and may exit the recess 800 at a lateral surface thereof.

In various embodiments, the center-to-center spacing of the ports 320 may range from, for example, approximately 0.1 mm to approximately 8 mm. In various embodiments, the diameter (or width) of the ports 320 may range from, for example, approximately 0.025 mm to approximately 5 mm. In various embodiments, the studs 620 (and/or other features protruding from the bottom surface of the top anode cooler 110) may have heights ranging from, for example, approximately 0.01 mm to approximately 15 mm. Although not shown in FIGS. 8A-8C, in various embodiments the anode cooler 100 shown in FIGS. 8A-8C may also be utilized with cathode cooler 200 thereon.

As shown, the top anode cooler 110 may be quite thin, and thus, the bottom anode cooler 120 may define a front depression 840 therein to accommodate the beam(s) emitted by the laser emitter on top of the top anode cooler 120. That is, in various embodiments, the top surface of the bottom anode cooler 120 may be substantially planar (except for recess 800 and any through-holes 300 formed therein), except for front depression 840 positioned forward of the top anode cooler 110 in the direction of the emitted beams. In the front depression 840, the top surface of the bottom anode cooler 120 may be recessed below the top surface by, for example, approximately 0.025 mm to approximately 50 mm.

One or more dimensions (e.g., length and/or width) and/or the surface area of the top anode cooler 110 may be less than the corresponding dimension(s) and/or surface area of the bottom anode cooler 120. For example, in various embodiments, the length of the top anode cooler 110 (e.g., in a direction parallel to that of the beams emitted by the laser emitter toward the front depression 840) may be less than 75%, less than 50%, less than 40%, less than 30%, or even less than 20% of the corresponding length of the bottom anode cooler 120 (and/or a top surface thereof). In various embodiments, the top anode cooler 110 and the bottom anode cooler 120 lack any channels (e.g., fluidic channels) defined therein oriented for the flow of cooling fluid substantially parallel to the top and/or bottom surfaces of the top anode cooler 110 and the bottom anode cooler 120.

Figure 8D:
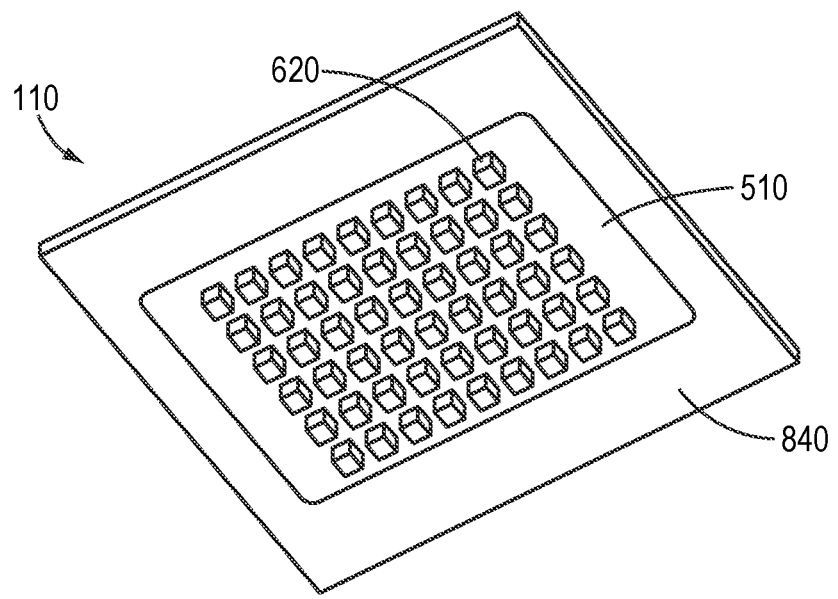
FIG. 8D is a perspective view of a top anode cooler in accordance with embodiments of the invention.

FIG. 8D is a view of the underside of the top anode cooler 110 depicted in FIGS. 8A-8D. As shown, in various embodiments, the impingement surface 510 may have the approximately same size and shape of the opening of the recess 800 in the bottom anode cooler 120 and may include one or more (typically a plurality of) protruding features such as studs 620 that enhance the cooling effect of the cooling-fluid jets directed thereon. As mentioned above, the impingement surface 510 may otherwise be substantially coplanar with an outer border 840 of the bottom surface of the top anode cooler 110; however, in various embodiments, the impingement surface 510 is not coplanar with outer border 840, i.e., the impingement surface 510 may protrude beneath or above the outer border 840. As shown in FIGS. 8A and 8B, the outer border 840 may receive the attachment material 810 and may thus attach the top anode cooler 110 to the bottom anode cooler 120. In various embodiments, the impingement surface 510 (and/or any protruding features thereon) may include, consist essentially of, or consist of a material different from that of the outer border 840 and/or another portion of the top anode cooler 110 (e.g., the top surface thereof).

In various embodiments, the impingement surface 510 does not include protruding features, i.e., the impingement surface 510 may be substantially planar. While such embodiments may be more easily manufactured, the lack of protruding features or other non-planar pattern may compromise the cooling efficacy of the cooling jets impinging upon the impingement surface 510.

Figure 8E:
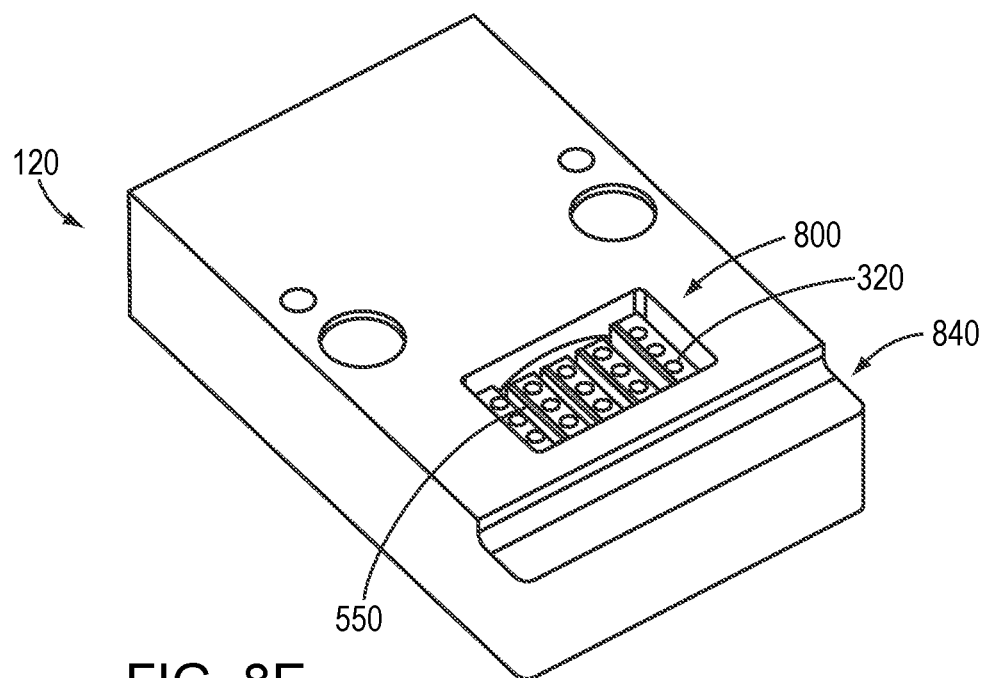
FIG. 8E is a perspective view of a bottom anode cooler in accordance with embodiments of the invention.

FIG. 8E is a top perspective view of a bottom anode cooler 120 in accordance with various embodiments of the invention. As shown, defined within the recess 800 may be one or more struts 550, for example, between rows of ports 320. As mentioned above, the struts 550 may provide enhanced mechanical strength to the anode cooler 100. In various embodiments, the struts 550 extend across an entire dimension (e.g., length and/or width) of the recess 800, while in other embodiments, the struts only extend partially across the corresponding dimension of recess 800. While the struts 550 extend above the openings of the ports 320, in typical embodiments the struts 550 do not extend all the way to the top surface of the bottom anode cooler 120 (i.e., out of the recess 800), and in various embodiments the struts 550 extend only part of the distance between the ports 320 and the features protruding from the impingement surface 510 in order to not block or otherwise retard the flow of cooling fluid within the recess 800.

In various embodiments, the struts 550 in bottom anode cooler 120 form, or help to form, exit channels for the flow of coolant fluid from the recess 800 via the exit channel 830. The presence of these struts 550 may help prevent a large variation of pressure between the ports 320 proximate the front of bottom anode cooler 120 (or "front ports") and the ports 320 proximate the exit channel 830 (or "rear ports"), because the coolant fluid will flow over a larger area, thereby resulting in lower coolant-fluid velocity over a larger area. This low pressure variance in turn facilitates the formation of more even flow between the front and rear ports, because the flow is a function of the pressure drop across the port.

Figure 9:
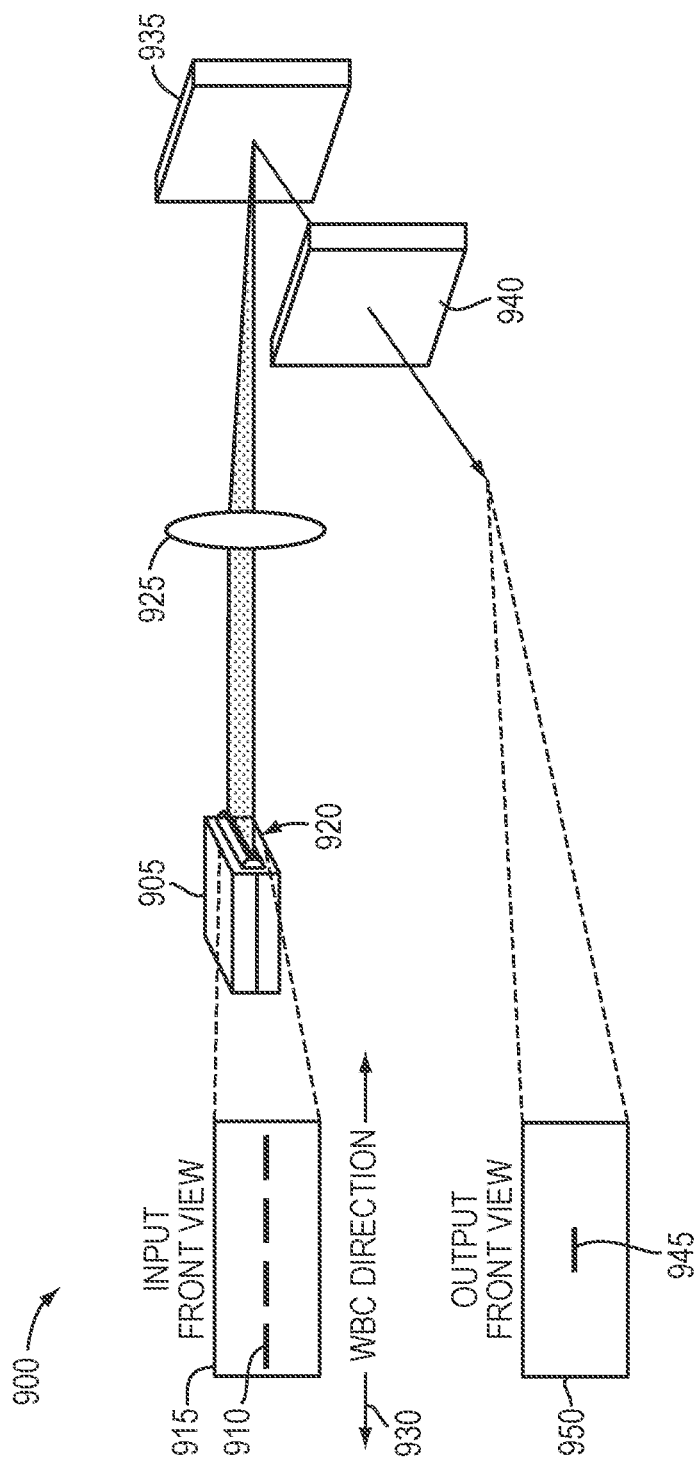
FIG. 9 is a schematic view of a wavelength beam combining laser system incorporating a packaged laser in accordance with embodiments of the invention.

Packaged laser emitters (e.g., diode bars) in accordance with embodiments of the present invention may be utilized in WBC laser systems. FIG. 9 depicts an exemplary WBC laser system 900 that utilizes a packaged laser 905. The packaged laser 905 may correspond to, for example, one or more laser emitters disposed within laser package 150 or disposed atop two-part anode cooler 100 as detailed herein, and may utilize for thermal management (e.g., cooling) one or more fluid jets as detailed herein. In the example of FIG. 9, laser 905 features a diode bar having four beam emitters emitting beams 910 (see magnified input view 915), but embodiments of the invention may utilize diode bars emitting any number of individual beams or two-dimensional arrays or stacks of diodes or diode bars. In view 915, each beam 910 is indicated by a line, where the length or longer dimension of the line represents the slow diverging dimension of the beam, and the height or shorter dimension represents the fast diverging dimension. A collimation optic 920 may be used to collimate each beam 910 along the fast dimension. Transform optic(s) 925, which may include or consist essentially of one or more cylindrical or spherical lenses and/or mirrors, are used to combine each beam 910 along a WBC direction 930. The transform optics 925 then overlap the combined beam onto a dispersive element 935 (which may include, consist essentially of, or consist of, e.g., a diffraction grating such as a reflective or transmissive diffraction grating), and the combined beam is then transmitted as single output profile onto an output coupler 940. The output coupler 940 then transmits the combined beams 945 as shown on the output front view 950. The output coupler 940 is typically partially reflective and acts as a common front facet for all the laser elements in this external cavity system 900. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 945 may be coupled into an optical fiber and/or utilized for applications such as welding, cutting, annealing, etc.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser package comprising:
    a bottom anode cooler having (i) a top surface, (ii) a bottom surface opposite the top surface, (iii) an entry recess defined in the bottom surface, (iv) a top recess defined in the top surface, and (v) fluidly connecting the entry recess and the top recess, a plurality of hollow ports for forming jets of cooling fluid therethrough, wherein the top surface of the bottom anode cooler comprises (a) a first portion surrounding the top recess, (b) a second portion, coplanar with the first portion, extending to a rear side of the bottom anode cooler, and (c) a front depression extending from the first portion to a front side of the bottom anode cooler and recessed below the first and second portions; and
    disposed above the bottom anode cooler, a top anode cooler having (i) a top surface and (ii) a bottom surface opposite the top surface, the bottom surface comprising an impingement surface and a planar outer border surrounding the impingement surface, wherein (a) the outer border is coupled to the first portion of the bottom anode cooler, and (b) the top anode cooler does not overlie the second portion of the top surface of the bottom anode cooler or the front depression,
    wherein (i) the impingement surface defines a non-planar pattern protruding into the top recess of the bottom anode cooler, whereby cooling fluid introduced into the bottom anode cooler and jetted through the ports strikes the impingement surface of the top anode cooler to cool a laser emitter when the laser emitter is disposed on the top surface of the top anode cooler, and (ii) the front depression of the bottom anode cooler accommodates one or more laser beams emitted by the laser emitter when the laser emitter is disposed on the top surface of the top anode cooler.

2. The laser package of claim 1, wherein at least a portion of at least one of the bottom anode cooler or the top anode cooler comprises at least one of copper, aluminum, stainless steel, CuW, tungsten, WC, alumina, mullite, diamond, or SiC.

3. The laser package of claim 1, wherein the non-planar pattern comprises a plurality of raised features.

4. The laser package of claim 1, wherein the bottom anode cooler defines a plurality of raised struts disposed between openings of the ports.

5. The laser package of claim 1, further comprising a cathode cooler (i) disposed over the top anode cooler, wherein a portion of the cathode cooler overhangs and does not contact the top surface of the top anode cooler.

6. The laser package of claim 5, wherein the cathode cooler is not configured for the flow of cooling fluid therethrough.

7. The laser package of claim 1, wherein the top anode cooler is not configured for the flow of cooling fluid therethrough.

8. The laser package of claim 1, wherein the non-planar pattern is spaced away from openings of the ports to form a mixing channel for the cooling fluid.

9. The laser package of claim 8, wherein the mixing channel has a height selected from the range of approximately 0.025 mm to approximately 50 mm.

10. The laser package of claim 8, wherein a ratio of the height of the mixing channel to a diameter of at least one of the ports is selected from the range of approximately 0.1 to approximately 30.

11. The laser package of claim 8, wherein a ratio of the height of the mixing channel to a diameter of at least one of the ports is selected from the range of approximately 8 to approximately 30.

12. The laser package of claim 8, wherein a ratio of the height of the mixing channel to a diameter of at least one of the ports is selected from the range of approximately 0.1 to approximately 2.

13. The laser package of claim 1, wherein a center-to-center spacing of the ports is selected from the range of approximately 0.1 mm to approximately 8 mm.

14. The laser package of claim 1, wherein a diameter of at least one of the ports is selected from the range of approximately 0.025 mm to approximately 5 mm.

15. The laser package of claim 1, wherein a surface area of an entirety of the top surface of the top anode cooler is smaller than a surface area of an entirety of the second portion of the top surface of the bottom anode cooler.

16. The laser package of claim 1, wherein the bottom anode cooler defines therewithin an exit channel fluidly connecting the top recess with an exit aperture defined in the bottom surface of the bottom anode cooler and spaced away from the entry recess.

17. The laser package of claim 16, wherein an entire portion of the bottom surface of the bottom anode cooler extending between the entry recess and the exit aperture is planar and parallel to the second portion of the top surface of the bottom anode cooler.

18. The laser package of claim 1, further comprising an attachment material attaching the outer border of the bottom surface of the top anode cooler to the first portion of the top surface of the bottom anode cooler.

19. The laser package of claim 18, wherein the attachment material comprises at least one of an adhesive, solder, or a brazing material.

20. The laser package of claim 1, wherein the bottom anode cooler comprises alumina and the top anode cooler comprises SiC.

21. The laser package of claim 1, further comprising the laser emitter disposed on the top surface of the top anode cooler, the laser emitter comprising a laser diode bar configured to emit a plurality of beams in a direction toward the front depression.

22. The laser package of claim 1, wherein the front depression is recessed below the first portion of the top surface of the bottom anode cooler by approximately 0.025 mm to approximately 50 mm.

23. The laser package of claim 1, wherein both the top anode cooler and the bottom anode cooler are electrically insulating.

* * * * *